(12) United States Patent
Suzuki et al.

(10) Patent No.: US 11,757,444 B2
(45) Date of Patent: Sep. 12, 2023

(54) SEMICONDUCTOR ELEMENT DRIVE DEVICE AND POWER CONVERSION APPARATUS

(71) Applicant: Hitachi Astemo, Ltd., Hitachinaka (JP)

(72) Inventors: Hiroshi Suzuki, Tokyo (JP); Masaki Shiraishi, Tokyo (JP); Koichi Yahata, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 0 days.

(21) Appl. No.: 17/796,850

(22) PCT Filed: Dec. 18, 2020

(86) PCT No.: PCT/JP2020/047354
§ 371 (c)(1),
(2) Date: Aug. 1, 2022

(87) PCT Pub. No.: WO2021/157221
PCT Pub. Date: Aug. 12, 2021

(65) Prior Publication Data
US 2023/0059002 A1    Feb. 23, 2023

(30) Foreign Application Priority Data
Feb. 3, 2020   (JP) .................. 2020-015962

(51) Int. Cl.
*H03K 17/16*    (2006.01)
*H03K 17/08*    (2006.01)
*H03K 17/567*   (2006.01)

(52) U.S. Cl.
CPC ........... *H03K 17/168* (2013.01); *H03K 17/08* (2013.01); *H03K 17/567* (2013.01); *H03K 2017/0806* (2013.01)

(58) Field of Classification Search
CPC .................................................. H03K 17/168
(Continued)

(56) References Cited

U.S. PATENT DOCUMENTS

2010/0213989 A1    8/2010  Nakatake et al.
2013/0214748 A1*   8/2013  Uota .................. H03K 17/0406
                                            323/234

FOREIGN PATENT DOCUMENTS

JP          9-46201 A     2/1997
JP       2000-232347 A    8/2000
(Continued)

OTHER PUBLICATIONS

International Search Report with English Translation and Written Opinion dated Apr. 20, 2021.

*Primary Examiner* — Tomi Skibinski
(74) *Attorney, Agent, or Firm* — Foley & Lardner LLP

(57) ABSTRACT

A semiconductor element drive device is provided to solve a problem that because a case of a change in the temperature of the semiconductor element or a current flowing through the semiconductor element is not take into consideration, switching loss and noise cannot be reduced sufficiently. In accordance with input sensing information (temperature T, current I), a timing control unit 3 outputs a delay signal Q to control timing of driving a current increasing circuit 5 so that a reduction of switching loss of an IGBT 101 is maximized. When the IGBT 101 is in turn-on mode or turn-off mode, the current increasing circuit 5 outputs a drive signal in response to the delay signal Q delayed by a given time from output of the drive instruction signal P. In this way, the current increasing circuit 5 increases the current that causes the gate capacitor of the IGBT 101 to be charged/discharged in response to the delay signal Q, thereby increasing a switching speed to reduce switching loss.

15 Claims, 15 Drawing Sheets

(58) Field of Classification Search
USPC .......................................................... 327/109
See application file for complete search history.

(56) References Cited

FOREIGN PATENT DOCUMENTS

| | | |
|---|---|---|
| JP | 2008-78816 A | 4/2008 |
| JP | 2013-168905 A | 8/2013 |
| JP | 2016-134882 A | 7/2016 |
| WO | WO 2009/044602 A1 | 4/2009 |

* cited by examiner

FIG. 12

| PULSE TIME (TEMPERATURE) | PULSE TIME (CURRENT) | ON-SIDE OPTIMUM DELAY | OFF-SIDE OPTIMUM DELAY |
|---|---|---|---|
| Dt1 | Di1 | D1 | d1 |
| Dt2 | Di2 | D2 | d2 |
| Dt3 | Di3 | D3 | d3 |
| ⋮ | ⋮ | ⋮ | ⋮ |
| Dtk | Dik | Dk | dk |
| ⋮ | ⋮ | ⋮ | ⋮ |
| Dtn | Din | Dn | dn |

| PULSE TIME (TEMPERATURE) | PULSE TIME (CURRENT) | ON-SIDE OPTIMUM DELAY | OFF-SIDE OPTIMUM DELAY |
|---|---|---|---|
| Dt1 | Di1 | D1−ΔD | d1−Δd |
| Dt2 | Di2 | D2−ΔD | d2−Δd |
| Dt3 | Di3 | D3−ΔD | d3−Δd |
| ⋮ | ⋮ | ⋮ | ⋮ |
| Dtk | Dik | Dk−ΔD | dk−Δd |
| ⋮ | ⋮ | ⋮ | ⋮ |
| Dtn | Din | Dn−ΔD | dn−Δd |

SEMICONDUCTOR ELEMENT DRIVE DEVICE AND POWER CONVERSION APPARATUS

TECHNICAL FIELD

The present invention relates to a semiconductor element drive device and a power conversion apparatus.

BACKGROUND ART

A power conversion apparatus that converts DC power into AC power or vice versa includes an inverter circuit composed of upper and lower arms of semiconductor elements. The semiconductor elements are each driven by a semiconductor element drive device. When each arm of the semiconductor element is driven to turn on or off, switching loss arises at the semiconductor element. In general, increasing a gate current to the semiconductor element results in a shorter time required for switching. In turning-on mode, therefore, turn-on switching loss decreases but a rate of change of current increases. Increasing the gate current, on the other hand, results in decreasing turn-off switching loss in turning-off mode but leads to an increasing turn-off surge voltage of the semiconductor element. An increase in the rate of change of current and in the turn-off surge voltage results in an increase in noise generation. In this manner, when the semiconductor element is driven, a tradeoff relationship between switching loss and noise holds, and balance between the switching loss and the noise need to be adjusted by the gate current.

PTL 1 discloses a technique according to which by driving a semiconductor element with a constant current during a turn-on period, variations in a period of collector voltage changes in a mirror period are suppressed, the mirror period continuing until a gate-collector capacitor is charged, and consequently variations in turn-on switching loss represented as the product of a collector voltage and a collector current are suppressed.

CITATION LIST

Patent Literature

PTL 1: WO 2009/044602 A

SUMMARY OF INVENTION

Technical Problem

The technique of PTL 1, however, does not take into consideration a case where the temperature of the semiconductor element or a current flowing through the semiconductor element changes, and cannot reduce switching loss and noise sufficiently, which is a problem.

Solution to Problem

A semiconductor element drive device according to the present invention includes: a current output circuit that outputs a gate current to a semiconductor element, based on a drive instruction signal for controlling on/off of the semiconductor element; a current increasing circuit that increases the gate current, based on a delay signal that is outputted after an elapse of a given time from a reference point of time of rising of the drive instruction signal or falling of the drive instruction signal; and a timing control unit that controls timing of output of the delay signal outputted during a mirror period that is after a point of time at which a current flowing through the semiconductor element reaches a given on-current value and before a point of time at which a voltage between both ends of the semiconductor element reaches a given on-voltage. The timing control unit controls timing of output of the delay signal, based on at least either a temperature of the semiconductor element or a current flowing through the semiconductor element.

Advantageous Effects of Invention

According to the present invention, even when the temperature of the semiconductor element or the current flowing through the semiconductor element changes, the switching loss and noise can be sufficiently reduced.

BRIEF DESCRIPTION OF DRAWINGS

FIG. 12 depicts an example of a lookup table in the timing control unit.

DESCRIPTION OF EMBODIMENTS

First Embodiment

Figure 1:
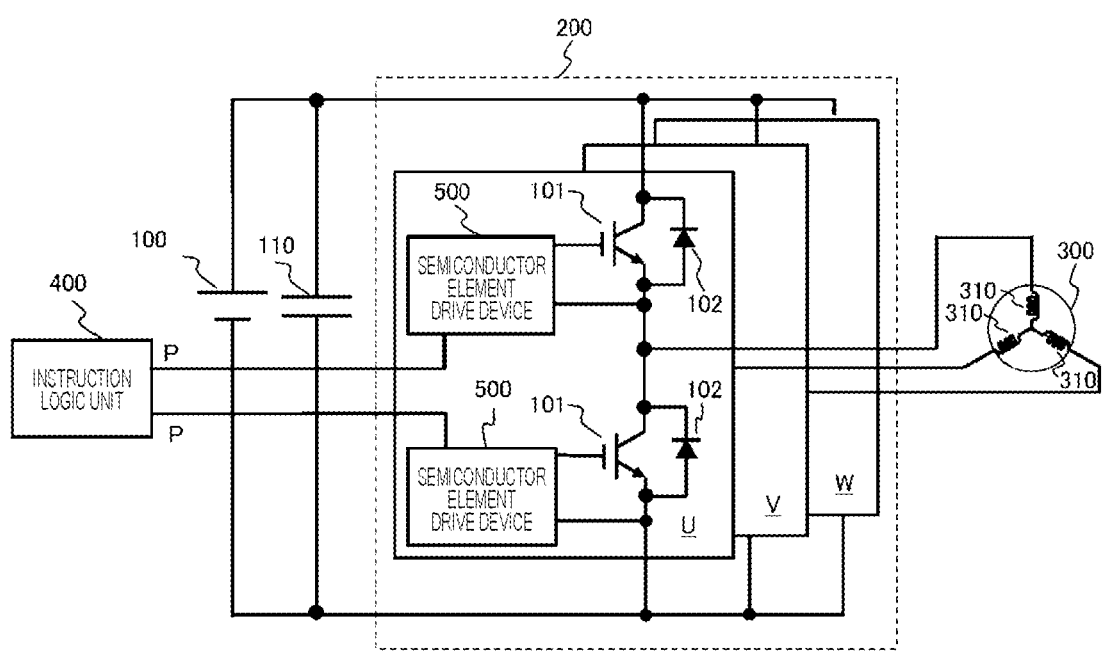
FIG. 1 depicts a control system for an electric motor using a power conversion apparatus.

An embodiment of the present invention will hereinafter be described with reference to the drawings. FIG. 1 depicts a control system for an electric motor 300 using a power conversion apparatus 200.

As shown in FIG. 1, the control system for the electric motor 300 includes a battery 100, the power conversion apparatus 200, the electric motor 300, and an instruction logic unit 400. The electric motor 300 is connected to the battery 100 via the power conversion apparatus 200. Between the battery 100 and the power conversion apparatus 200, a smoothing capacitor 110 is provided. The electric motor 300 is, for example, a synchronous electric motor of a permanent magnet field type.

The power conversion apparatus 200 includes a three-phase inverter circuit composed of three sets of upper and lower arms of three phases: a U-phase, a V-phase, and a W-phase. Semiconductors making up the upper and lower arms, respectively, are each composed of an IGBT 101. To a high potential side terminal of the IGBT 101 of the upper arm of each phase, a first end of the smoothing capacitor 110 is connected. To a low potential side terminal of the IGBT 101 of the upper arm of each phase, a high potential side terminal of the IGBT 101 of the lower arm of each phase is connected. To a low voltage terminal side of the IGBT 101 of the lower arm of each phase, a second end of the smoothing capacitor 110 is connected. In each phase, a first end of a coil 310 of the electric motor 300 is connected to a connection point between the low potential side terminal of the IGBT 101 of the upper arm and the high potential side terminal of the IGBT 101 of the lower arm. Respective second ends of coils 310 of three phases are connected together at a neutral point.

In this embodiment, an IGBT is used as a voltage control type semiconductor element. In the IGBT 101, therefore, the high potential side terminal works as a collector as the low potential side terminal works as an emitter. To each IGBT 101, a freewheeling diode 102 is connected in parallel in a reverse flow direction. The semiconductor element is not limited to the IGBT, and may be provided as a voltage-driven semiconductor element, such as a MOSFET. A semiconductor making up the semiconductor element may bP silicon (Si) or a wide-gap semiconductor (silicon carbide or SiC), gallium nitride (GaN), or the like.

To adjust a controlled variable of the electric motor 300 to an instruction value, the instruction logic unit 400 puts the IGBT 101 of the upper arm and the IGBT 101 of the lower arm in an on-state alternately in each phase. The controlled variable is, for example, torque. The instruction logic unit 400 outputs an on-instruction for switching to an on-state or an off-instruction for switching to an off-state, the instruction being outputted as a drive instruction signal P for the IGBT 101, to a semiconductor element drive device 500 separately provided in correspondence to the IGBT 101 of each arm of each phase.

The semiconductor element drive device 500 acquires the drive instruction signal P from the instruction logic unit 400, and puts the IGBT 101 in the on-state or off-state, based on the acquired drive instruction signal P.

Figure 2:
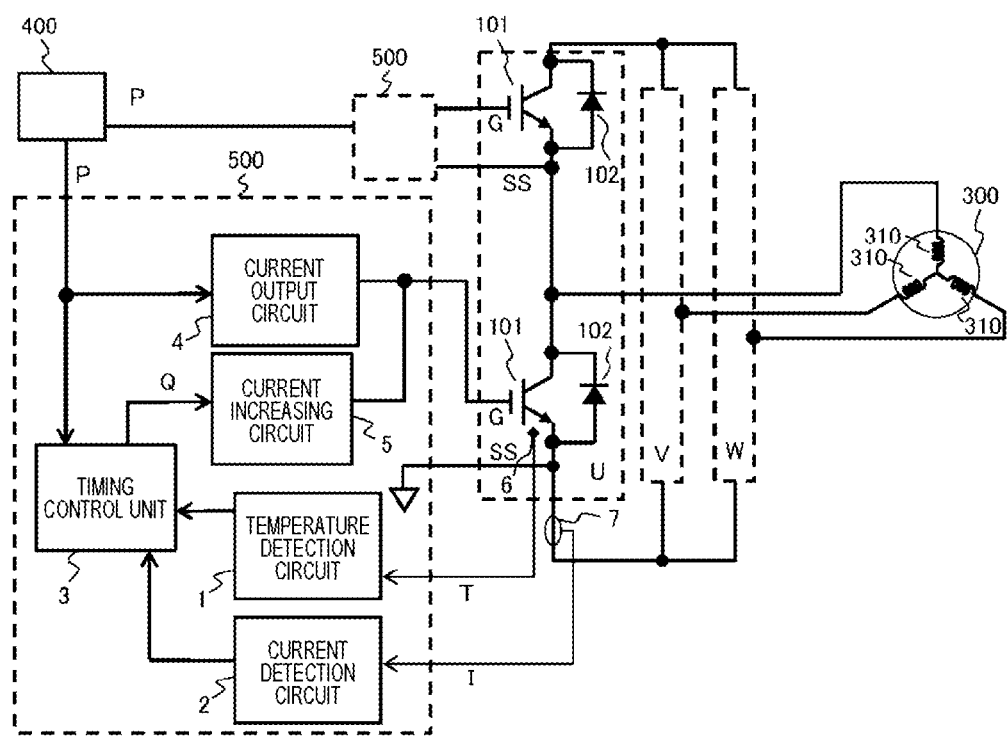
FIG. 2 is a block diagram showing a configuration of a semiconductor element drive device.

FIG. 2 is a block diagram showing a configuration of the semiconductor element drive device 500.

FIG. 2 shows only the semiconductor element drive device 500 corresponding to the lower arm of the U-phase in the three-phase inverter circuit shown in FIG. 1. It should be noted, however, that respective semiconductor element drive devices 500 of the upper arm of the U-phase and upper and lower arms of the V-phase and the W-phase have the same configuration as that of the semiconductor element drive device 500 of the lower arm of the U-phase. Hereinafter, the configuration and operation of the semiconductor element drive device 500 of the lower arm of the U-phase will be described. It should be noted, however, that the configuration and operation of each of other semiconductor element drive devices 500 is the same as the configuration and operation of the semiconductor element drive device 500 of the lower arm of the U-phase.

The semiconductor element drive device 500 is connected to a gate terminal G and a sense emitter terminal (auxiliary emitter terminal) SS of the IGBT 101. The semiconductor element drive device 500 is connected also to the instruction logic unit 400, which is an upper-order element.

As shown in FIG. 2, the semiconductor element drive device 500 includes a temperature detection circuit 1, a current detection circuit 2, a timing control unit 3, a current output circuit 4, and a current increasing circuit 5. To the temperature detection circuit 1, an output portion of the temperature detection element 6 is connected. To the current detection circuit 2, an output portion of the current detection element 7 is connected. To an input portion of the timing control unit 3, respective output portions of the temperature detection circuit 1, the current detection circuit 2, and the instruction logic unit 400 are connected. The current output circuit 4 is connected between an output portion of the instruction logic unit 400 and the gate terminal G of the IGBT 101. The current increasing circuit 5 is connected between an output portion of the timing control unit 3 and the gate terminal G of the IGBT 101.

The instruction logic unit 400 inputs a drive instruction signal P to the semiconductor element drive device 500. In a period during which the drive instruction signal P is inputted to the semiconductor element drive device 500, the semiconductor element drive device 500 applies a voltage (e.g., +15 V) higher than a threshold voltage of the IGBT 101 between the gate G and the emitter SS of the IGBT 101, thus switching the IGBT 101 on to cause a current to flow through the IGBT 101. In short, the IGBT 101 is turned on. In a period during which no drive instruction signal P from the instruction logic unit 400 is inputted to the semiconductor element drive device 500, the semiconductor element drive device 500 applies a voltage (e.g., 0 V) lower than the threshold voltage between the gate G and the emitter SS of the IGBT 101, thus switching the IGBT 101 off to cut off a current flow to the IGBT 101. In short, the IGBT 101 is turned off.

The above turn-on or turn-off operation is performed by causing a gate capacitor of the IGBT 101 to be charged or discharged through the current output circuit 4 of the semiconductor element drive device 500.

The semiconductor element drive device 500 senses operating conditions for the IGBT 101, which are the temperature T of the IGBT 101 and a current I flowing through the IGBT 101, by the temperature detection element 6 and the current detection element 7, respectively. These pieces of sensing information (temperature T, current I) are inputted to the timing control unit 3 through the temperature detection circuit 1 and the current detection circuit 2. As the current detection element 7, a current probe (current transformer or CT, Rogowski coil, etc.) or a shunt resistance is used. An estimated value of a current flowing through the IGBT 101 may be calculated from a measurement of a load current flowing through the electric motor 300. As the temperature detection element 6, for example, a thermistor or the like is used. An estimated value of the temperature of the IGBT 101 may be calculated from a measurement of an electrical characteristic parameter TSEP (Temperature Sensitive Electrical Parameter) of the semiconductor element, such as an on-voltage of the IGBT 101, the electrical characteristic parameter changing depending on temperature.

In accordance with the incoming sensing information (temperature T, current I), the timing control unit 3 outputs a delay signal Q to control drive timing of the current increasing circuit 5 so that a reduction in switching loss of the IGBT 101 is maximized. This process will be described later. When the IGBT 101 is in turn-on mode or turn-off mode, the current increasing circuit 5 outputs a drive signal in response to the delay signal Q delayed by a given time from output of the drive instruction signal P. Specifically, the current increasing circuit 5 increases the current that causes the gate capacitor of the IGBT 101 to be charged/discharged (which will hereinafter be referred to as gate current) in response to the delay signal Q, thereby increasing a switching speed to reduce switching loss.

FIGS. 3(A) to 3(D) depict a switching operation of the semiconductor element. FIG. 3(A) shows a gate-emitter voltage Vge and a collector-emitter voltage Vice, FIG. 3(B) shows a collector current Ic, FIG. 3(C) shows the drive instruction signal P, and FIG. 3(D) shows the delay signal Q. In each figure, the horizontal axis represents time. A broken line in FIG. 3(A) indicates a case where this embodiment is implemented, that is, a case where the delay signal Q is applied. FIGS. 3(A) to 3(D) depict a turn-on operation, which is similar to a turn-off operation in items of switching behavior.

When the drive instruction signal P is inputted from the instruction logic unit 400, as shown in FIG. 3(C), a voltage is applied from the current output circuit 4 to the gate terminal G of the IGBT 101. In other words, the gate-emitter voltage Vge gradually increases, as shown in FIG. 3(A). When the gate-emitter voltage Vge exceeds a threshold voltage Vth, the collector current Ic starts to flow, as shown in FIG. 3(B).

In the case where this embodiment is not implemented, i.e., the case where the delay signal Q is not applied, the collector-emitter voltage Vice starts decreasing from a point of time α at which the collector current Ic reaches an on-current Ion, and at the same time, the gate-emitter voltage Vge remains a constant value from the point of time α. In a mirror period from the point of time α, at which the on-current Ion is reached, to a point of time β, at which the collector-emitter voltage Vce reaches an on-voltage Von, the turn-on operation is completed. In this process, if the switching speed is increased (that is, the gate current is increased) before the point of time α, it increases a rate of time-dependent change di/dt of the collector current Ic, thus increasing noise. Increasing the gate current after the point of time β, on the other hand, offers no effect of reducing switching loss (turn-on switching loss Eon) because the switching operation is already over after the point of time β.

For this reason, according to this embodiment, the gate current is increased between the point of time α and the point of time β, that is, during the mirror period. Specifically, the current increasing circuit 5 increases the gate current, based on the delay signal Q that is outputted after an elapse of a given time from a reference point of time of rising of the drive instruction signal P (turn-on operation) or falling of the drive instruction signal P (turn-off operation). FIG. 3(D) shows an example in which the delay signal Q is outputted at the point of time α at which the given time has been elapsed from the reference point of time of rising of the drive instruction signal P (turn-on operation). As indicated by a broken line in FIG. 3(A), the gate-emitter voltage Vge increases during the mirror period. In the mirror period, a rate of time-dependent change dv/dt of the collector-emitter voltage Vce increases as well. Before the mirror period starts, the rate of time-dependent change di/dt of the collector current Ic remains constant, as shown in FIG. 3(B). In the mirror period, however, the rate of time-dependent change dv/dt of the collector-emitter voltage Vice can be increased. Because of the increased rate of time-dependent change dv/dt, the turn-on switching loss Eon determined by time integral of the product of the collector-emitter voltage Vice and the collector current Ic can be reduced. This allows semiconductor driving with less noise and loss.

Figure 4:
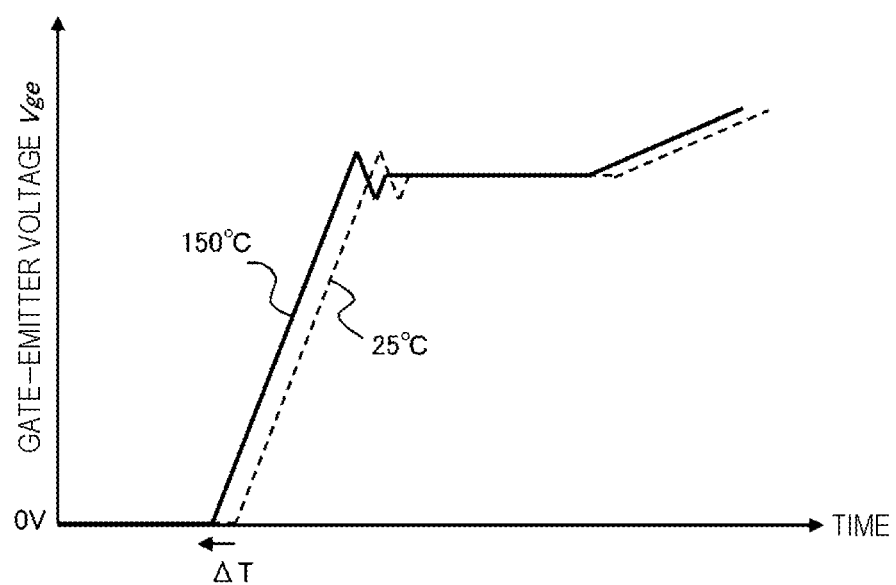
FIG. 4 depicts a state in which a gate-emitter voltage changes depending on temperature.

FIG. 4 depicts a state in which the gate-emitter voltage Vge changes depending on temperature. The vertical axis represents the gate-emitter voltage Vge, and the horizontal axis represents time.

In FIG. 4, a case of the temperature of the IGBT 101, i.e., the semiconductor element, being 25° C. is indicated by a broken line, and a case of the temperature of the IGBT 101 being 150° C. is indicated by a solid line. As shown in FIG. 4, in the case of the temperature of the IGBT 101 being 150° C., the rising of the gate-emitter voltage Vge following input of the drive instruction signal P at the time of the IGBT 101 being in turn-on mode is earlier by ΔT than the same in the case of the temperature of the IGBT 101 being 25° C. As a result, a time to take from the point of input of the drive instruction signal P to the point of arrival of the mirror period at the IGBT 101 (a time to take from the point of input of the drive instruction signal P to the point of time α in FIG. 3) gets shorter by ΔT. Specifically, when the temperature of the IGBT 101 changes from 25° C. to 150° C., ΔT is about 35 ns. Meanwhile, the duration T of the mirror period is about 250 ns. ΔT, therefore, accounts for about 14% of the mirror period. Similarly, it has been found that even when an on-current of the IGBT 101 changes, a larger on-current value leads to a longer time to take from the point of input of the drive instruction signal P to the point of arrival of the mirror period at the IGBT 101, thus creating ΔT. In addition, the higher the temperature T is, the lower the threshold voltage (Vth) becomes, which makes arrival of the mirror period earlier. In this manner, the time to take from the point of input of the drive instruction signal P to the point of arrival of the mirror period changes depending on the temperature of the IGBT 101. In turn-off mode, this time changes depending on the temperature in the same manner as in turn-on mode. The time to take to reach the point of arrival of the mirror period changes also depending on the collector current Ic flowing through the IGBT 101.

In this manner, when the temperature of the IGBT 101 or the current flowing through the IGBT 101 changes, that is, when the operation condition for the IGBT 101 changes, a switching loss reduction effect cannot be obtained unless the current increasing circuit 5 controls timing of increasing the gate current to the IGBT 101. A change in the operation condition increases noise caused by a switching operation. In general, a semiconductor element (power semiconductor module) for electric vehicles or hybrid vehicles switches at higher speed than a semiconductor element (power semiconductor module) for railway vehicles or power equipment. For the case of such a semiconductor, therefore, the ratio of ΔT to the mirror period cannot be ignored, as indicated above. In this case, it is necessary to optimize timing of increasing the gate current while taking account of a change in the operation condition. In this embodiment, timing of outputting the delay signal Q is controlled, based on the temperature of the semiconductor element or the current flowing through the semiconductor element.

Further, a power semiconductor module used in electric vehicles or hybrid vehicles switches at a frequency several to several tens times as large as a frequency at which a power semiconductor module used in railway vehicles switches. In application of the former power semiconductor module, therefore, reducing switching loss offers a greater effect of reducing overall inverter loss. Implementing this embodiment, therefore, allows a reduction in the size, weight, and cost of a power conversion apparatus for use in automobiles.

Figure 5:
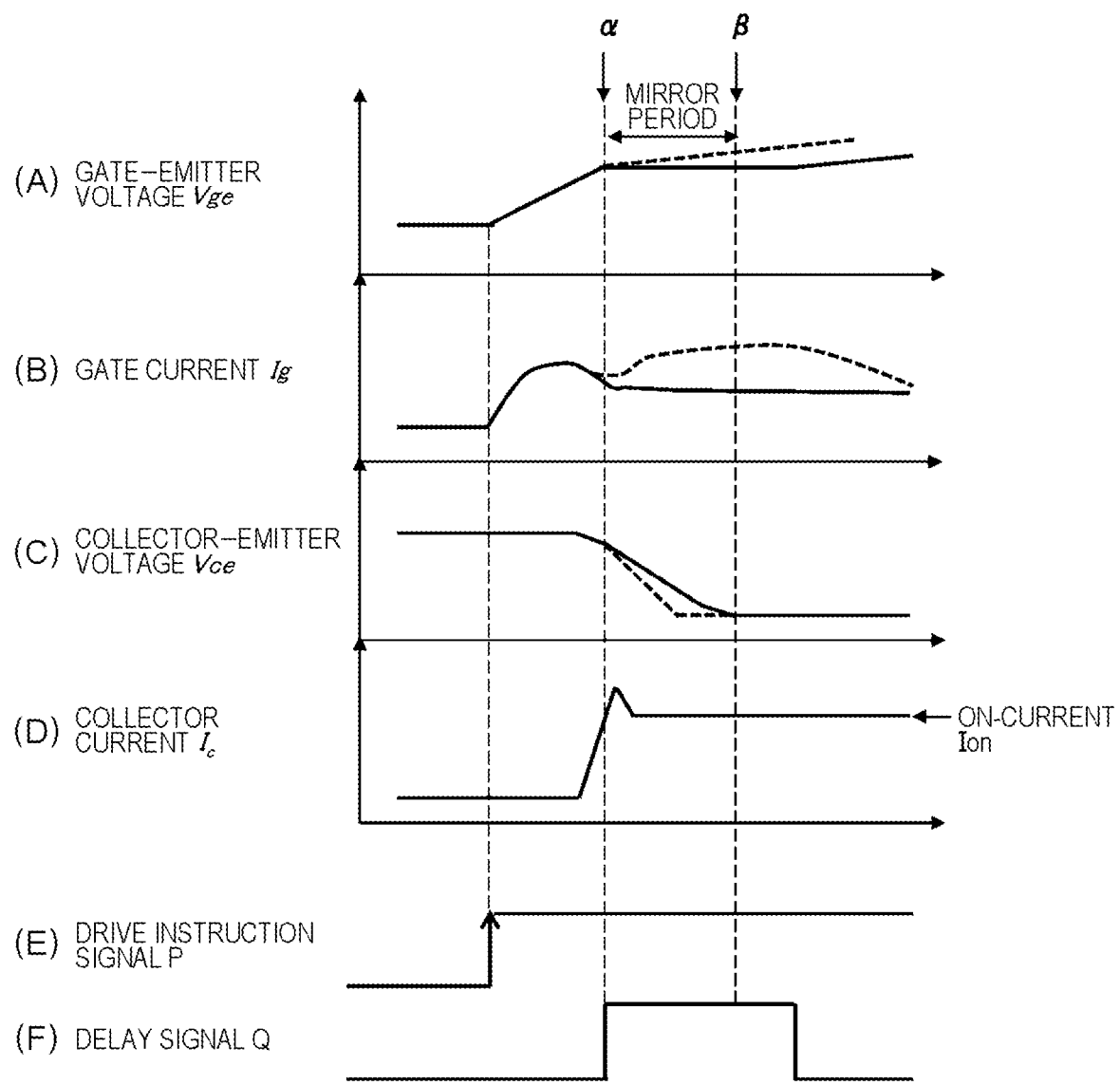
FIGS. 5(A), 5(B), 5(C), 5(D), 5(E), and 5(F) depict a switching operation of the semiconductor element in detail.

FIG. 5 depicts a switching operation of the semiconductor element in detail. FIG. 5(A) shows the gate-emitter voltage Vge, FIG. 5(B) shows a gate current Ig, FIG. 5(C) shows the collector-emitter voltage Vce, FIG. 5(D) shows the collector current Ic, FIG. 5(E) shows the drive instruction signal P, and FIG. 5(F) shows the delay signal Q. In each figure, the horizontal axis represents time. Broken lines in FIGS. 5(A) to 5(C) indicate a case where this embodiment is implemented, that is, a case where the delay signal Q is applied. FIGS. 5(A) to 5(F) depict a turn-on operation, which is similar to a turn-off operation in terms of switching behavior.

When the drive instruction signal P is inputted from the instruction logic unit 400, as shown in FIG. 5(E), a voltage is applied from the current output circuit 4 to the gate terminal G of the IGBT 101, which causes the gate current Ig to flow, as shown in FIG. 5(B). Then, the gate-emitter voltage Vge gradually increases, as shown in FIG. 5(A). When the gate-emitter voltage Vge exceeds the threshold voltage Vth, the collector current Ic starts to flow, as shown in FIG. 5(D), which causes the collector-emitter voltage Vice to drop, as shown in FIG. 5(C).

In the case where this embodiment is not implemented, i.e., the case where the delay signal Q is not applied, the collector-emitter voltage Vce starts decreasing from the point of time α at which the collector current Ic reaches the on-current Ion, as shown in FIG. 5(C), and at the same time, the gate-emitter voltage Vge remains a constant value from the point of time α, as shown in FIG. 5(A). The mirror period continues from the point of time α to the point of time β, and the turn-on operation is completed during this period.

In this embodiment, the gate current is increased between the point of time α and the pint of time β, that is, during the mirror period. Specificall the current increasing circuit 5 increases the gate current, based on the delay signal Q that is outputted after an elapse of a given time from a reference point of time of rising of the drive instruction signal P (turn-on operation) or falling of the drive instruction signal P (turn-off operation). FIG. 5(F) shows an example in which the delay signal Q is outputted at the point of time α at which the given time has been elapsed from the reference point of time of rising of the drive instruction signal P (turn-on operation). As indicated by a broken line in FIG. 5(A), the gate-emitter voltage Vge increases during the mirror period. In addition, as indicated by a broken line in FIG. 5(B), the gate current Ig increases during the mirror period. In this embodiment, because the current increasing circuit 5 increases the gate current to the IGBT 101 during the mirror period, the waveform of the gate current Ig has two crests, as indicated by the broken line in FIG. 5(B). As shown in FIG. 5(D), the collector current Ic does not change when the gate current Ig is increased in the mirror period.

Figure 6:
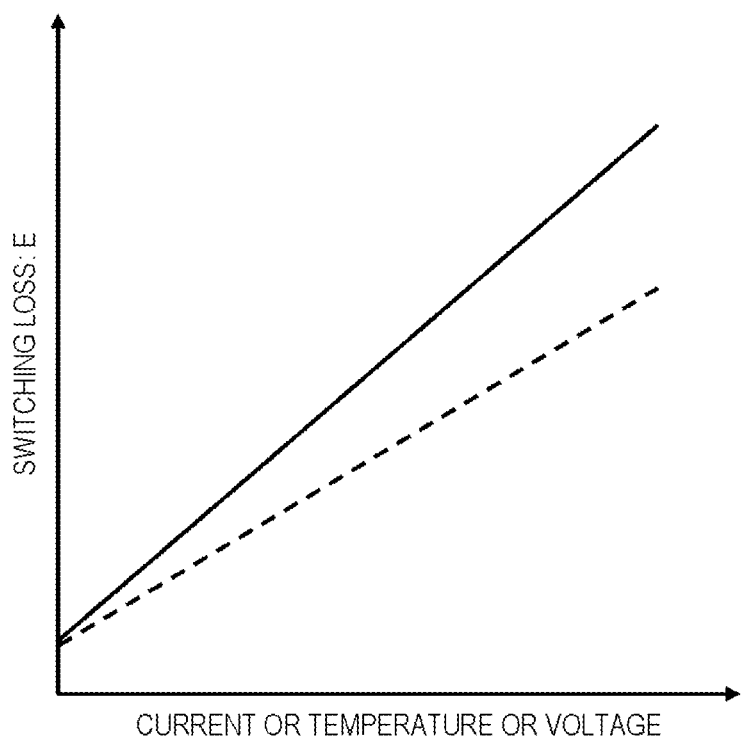
FIG. 6 is a graph showing a relationship between switching loss and an operation condition.

FIG. 6 is a graph showing a relationship between switching loss and an operation condition. The vertical axis represents the switching loss, and the horizontal axis represents the operation condition. In FIG. 6, a broken line indicates a case where this embodiment is implemented. As shown in FIG. 6, when the operating condition, such as the temperature of the semiconductor element, a current flowing through the semiconductor element, or a voltage applied to the semiconductor element, increases, the switching loss increases substantially in proportion to the increase of the operating condition. An increase in the switching loss, however, becomes gentler in the case where this embodiment is implemented. In this embodiment, because the gate current is increased at optimum timing, a reduction of the switching loss can be maximized for each current, each temperature, or each voltage. In this case, as described above, di/dt in turn-on mode is the same as that in a conventional case. The switching loss can therefore be reduced over the entire ranges of current, temperature, and voltage of the IGBT without increasing radiation noise.

Figure 7:
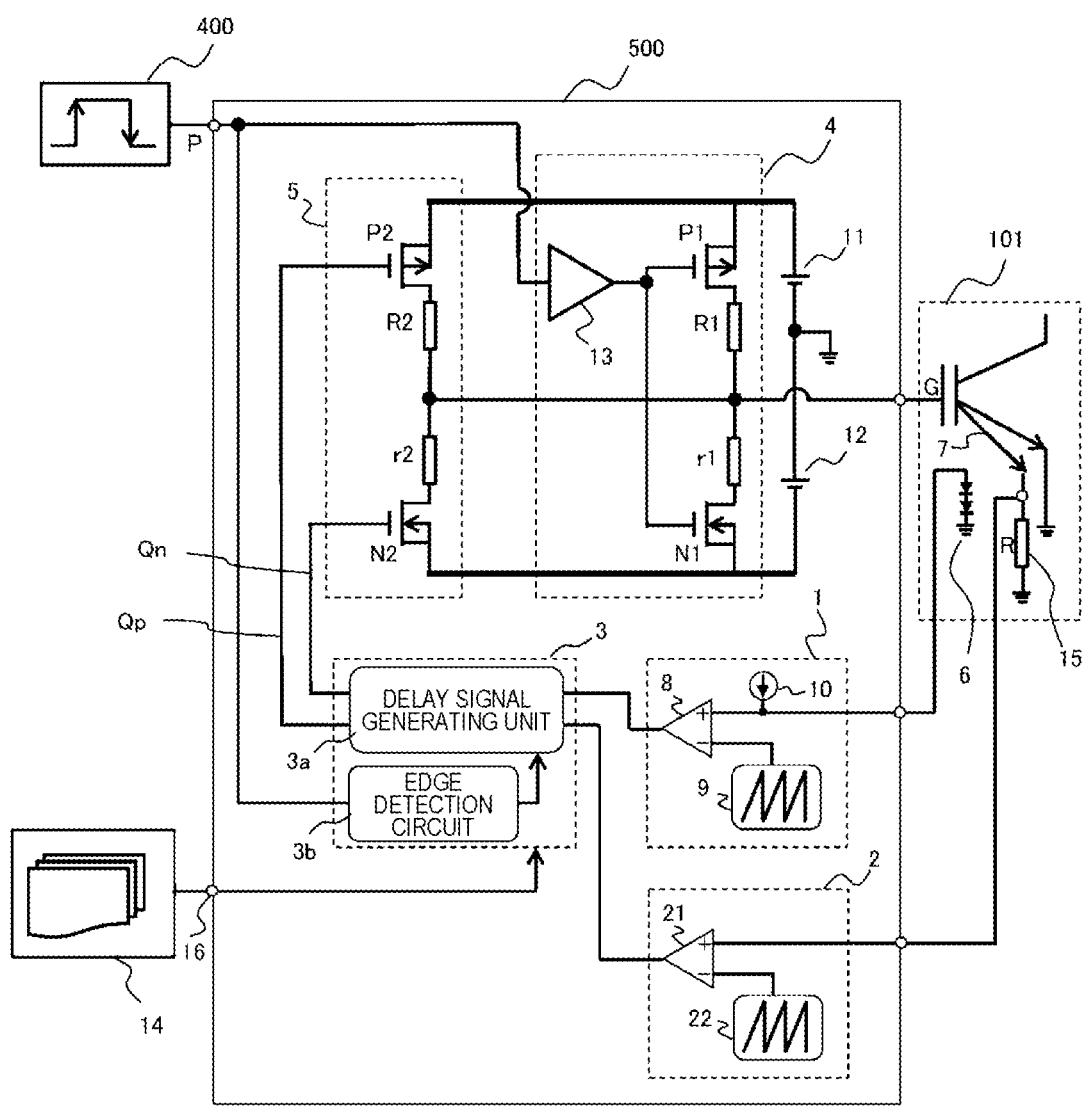
FIG. 7 depicts a circuit configuration of the semiconductor element drive device.

FIG. 7 depicts a circuit configuration of the semiconductor element drive device 500. The same components as those shown in FIG. 2 are denoted by the same reference numerals and are omitted in further description.

The current output circuit 4 includes a P-type MOSFET (P1), an N-type MOSFET (N1), an on-side gate resistance (R1), an off-side gate resistance (r1), a positive-side voltage source 11, a negative-side voltage source 12, and a pre-driver 13. A source terminal of P1 is connected to the positive-side voltage source 11, and a gate terminal of P1 is connected to an output portion of the pre-driver 13. A source terminal of N1 is connected to the negative-side voltage source 12, and a gate terminal of N1 is connected to the output portion of the pre-driver 13. A drain terminal of P1 is connected to the gate terminal G of the IGBT 101 via R1, while a drain terminal of Ni is connected to the gate terminal G via r1. The input portion of the pre-driver 13 is connected to an output portion of the instruction logic unit 400.

The current increasing circuit 5 includes a P-type MOSFET (P2), an N-type MOSFET (N2), an on-side gate resistance (R2), an off-side gate resistance (r2), a positive-side voltage source 11, and a negative-side voltage source 12. A source terminal of P2 is connected to the positive-side voltage source 11, and a gate terminal of P2 is connected to a delay signal generating unit 3a of the timing control unit 3. A source terminal of N2 is connected to the negative-side voltage source 12, and a gate terminal of N2 is connected to the delay signal generating unit 3a of the timing control unit 3. A drain terminal of P2 is connected to the gate terminal G of the IGBT 101 via R2, while a drain terminal of N2 is connected to the gate terminal G via r2.

In a period during which the drive instruction signal P from the instruction logic unit 400 is inputted to the pre-driver 13, the pre-driver 13 switches P1 and N1 on and off, respectively, thus causing a current to flow from the semiconductor element drive device 500 to the gate terminal G of the IGBT 101 and turn the IGBT 101 on. In a period during which no drive instruction signal P from the instruction logic unit 400 is inputted to the pre-driver 13, the pre-driver 13 switches P1 and N1 off and on, respectively, thus causing a current to flow from the semiconductor element drive device 500 to the gate terminal G of the IGBT 101 and turn the IGBT 101 off. It should be noted that the negative-side voltage source 12 does not always apply a negative voltage, and may apply a voltage of, for example, 0 V.

In turn-on mode, in response to the delay signal Qp, P2 of the current increasing circuit 5 turns on later than P1 of the current output circuit 4 by a delay D, which allows the gate current to be increased in the middle of the turn-on operation. This process will be described later. At this time, by setting R1>R2, the gate current can be increased effectively. Setting R2=0Ω, in particular, maximizes an effect of reducing turn-on switching loss Eon.

Similarly, in turn-off mode, N2 of the current increasing circuit 5, responding to the delay signal Qn, turns on later than N1 of the current output circuit 4 by a delay d, which allows the gate current to be increased in the middle of the turn-off operation. At this time, by setting r1>r2, the gate current can be increased effectively. Setting r2=0Ω, in particular, maximizes an effect of reducing turn-off switching loss (Eoff).

In this manner, by causing the current increasing circuit 5 to operate with a proper time lag, i.e., delay (D, d) after the current output circuit 4 outputs a current, the switching loss can be reduced in a manner shown in FIG. 6.

The temperature detection circuit 1 includes a comparator 8, a sawtooth wave generating circuit 9, and a constant current source 10. The temperature detection element 6 is a diode made of polysilicon or the like and packaged on the same semiconductor chip on which the IGBT 101 is mounted. A constant current flow in this diode causes a voltage drop (VF) that depends on temperature. Using this phenomenon, the temperature T of the IGBT 101 is detected. The diode mounted on the chip carrying the IGBT 101 is superior in temperature detection accuracy and response speed to a thermistor that, in general, needs to be disposed in a location slightly away from the IGBT-carrying chip. An output portion of the constant current source 10 is connected to an anode of the temperature detection diode 6 and to a non-inverting input terminal of the comparator 8, and an output unit of the sawtooth wave generating circuit 9 is connected to an inverting input terminal of the comparator 8.

The current detection circuit 2 includes a comparator 21 and a sawtooth wave generating circuit 22. The current detection element 7 is a sense IGBT, which is a sense element packaged on the same semiconductor chip on which the IGBT 101 is mounted. An emitter of the sense IGBT is connected to a ground node via a shunt resistance 15. The sense IGBT carries a sense current ($\alpha*I$) given by multiplying the current I flowing through the IGBT 101 by a sense ratio $\alpha$, and detects the current I flowing through the IGBT 101 in terms of a voltage drop ($R*\alpha*I$) that occurs at the shunt resistance 15 with a resistance value R. A non-inverting input terminal of the comparator 21 is connected to a connection point between the emitter of the sense IGBT 7 and the shunt resistance 15, and an inverting input terminal of the comparator 21 is connected to an output portion of the sawtooth wave generating circuit 22.

In the temperature detection circuit 1, a voltage drop (VF) at the temperature detection diode 6 and a sawtooth wave from the sawtooth wave generating circuit 9 are compared in voltage level by the comparator 8. As a result, the temperature T of the IGBT 101 is converted into a pulse time signal of a rectangular wave and then inputted to the delay signal generating unit 3a of the timing control unit 3. Similarly, in the current detection circuit 2, a voltage drop ($R*\alpha*I$) that occurs at the shunt resistance 15 and a sawtooth wave from the sawtooth wave generating circuit 22 are comparted in voltage level by the comparator 21. As a result, the current I flowing through the IGBT 101 is converted into a pulse time signal of a rectangular wave and inputted to the delay signal generating unit 3a of the timing control unit 3. In the configuration of FIG. 7, the higher the temperature T of the IGBT 101 and the larger the current I flowing through the IGBT 101, the longer the width of the pulse time signals representing the temperature T and the current I, respectively, which are sensing information inputted to the delay signal generating unit 3a.

The timing control unit 3 includes the delay signal generating unit 3a and an edge detection circuit 3b. An input portion of the delay signal generating unit 3a is connected to respective output portions of the temperature detection circuit 1, the current detection circuit 2, and the edge detection circuit 3b. The delay signals Qp and Qn outputted from the delay signal generating unit 3a are applied to a gate terminal of the P-type MOSFET (P2) and a gate terminal of the N-type MOSFET (N2) in the current increasing circuit 5, respectively. To an input portion of the edge detection circuit 3b, the drive instruction signal P is inputted, the drive instruction signal P being outputted from the instruction logic unit 400. To the timing control unit 3, a delay control unit 14 is connected via a digital input terminal 16.

Figure 8:
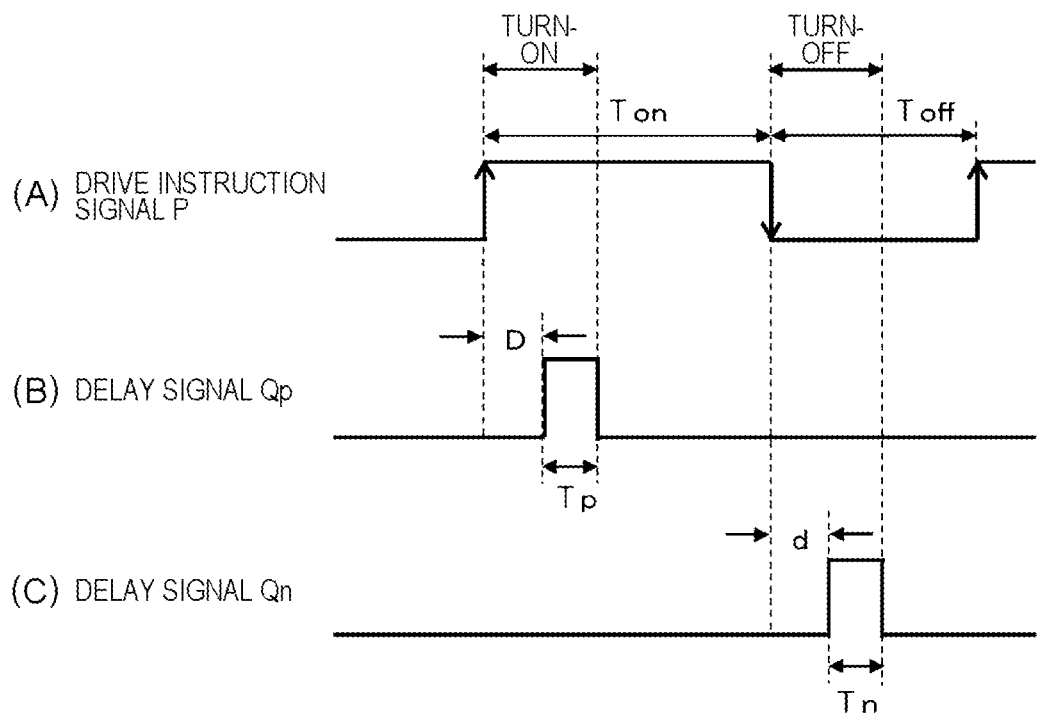
FIGS. 8(A), 8(B), and 8(C) depict input signals to a current increasing circuit of the semiconductor element drive device.

FIG. 8 depicts input signals to the current increasing circuit 5 of the semiconductor element drive device 500. FIG. 8(A) shows the drive instruction signal P, FIG. 8(B) shows the delay signal Qp, and FIG. 8(C) shows the delay signal Qn.

The edge detection circuit 3b shown in FIG. 7 detects a rising edge (↑) and a falling edge (↓) of the drive instruction signal P shown in FIG. 8(A), the drive instruction signal P being outputted from the instruction logic unit 400 to the edge detection circuit 3b, and sends a detection signal to the delay signal generating unit 3a.

When the IGBT 101 is in turn-on mode, after receiving a rising edge detection signal, the delay signal generating unit 3a outputs a pulse signal (delay signal Qp) of time Tp with the delay D, to the gate terminal of the P-type MOSFET (P2) of the current increasing circuit 5, thus turning P2 on, as shown in FIG. 8(B). The delay D is set so that timing of increasing the gate current (i.e., turning P2 on) is in the mirror period (T) shown in FIG. 3. The time Tp is set as a proper fixed value so that P2 is turned off before the start of a turn-off operation (D+Tp<Ton).

When the IGBT 101 is in turn-off mode, after receiving a falling edge detection signal, the delay signal generating unit 3a outputs a pulse signal (delay signal Qn) of time Tn with the delay d, to the gate terminal of the N-type MOSFET (N2) of the current increasing circuit 5, thus turning N2 on, as shown in FIG. 8(C). The delay d is set so that timing of increasing the gate current (i.e., turning N2 on) is in the mirror period (T) shown in FIG. 3. The time Tn is set as a proper fixed value so that N2 is turned off before the start of the next turn-on operation (d+Tn<Toff).

By controlling the delays D and d in this manner, when the IGBT 101 is in turn-on mode or turn-off mode, the gate current is increased in proper timing matched to the mirror period. This allows effective reduction of the switching loss.

The delay control unit 14 sets the optimum delays D and d in accordance with the temperature T and the current I of the IGBT 101, and stores the set delays D and d in the timing control unit 3. As a result, the delay signal generating unit 3a can autonomously increase the gate current at optimum timing according to the current operation condition (temperature T, current I) for the IGBT 101 and can maximize a reduction of the switching loss for each current or each temperature, as shown in FIG. 6.

Figure 3:
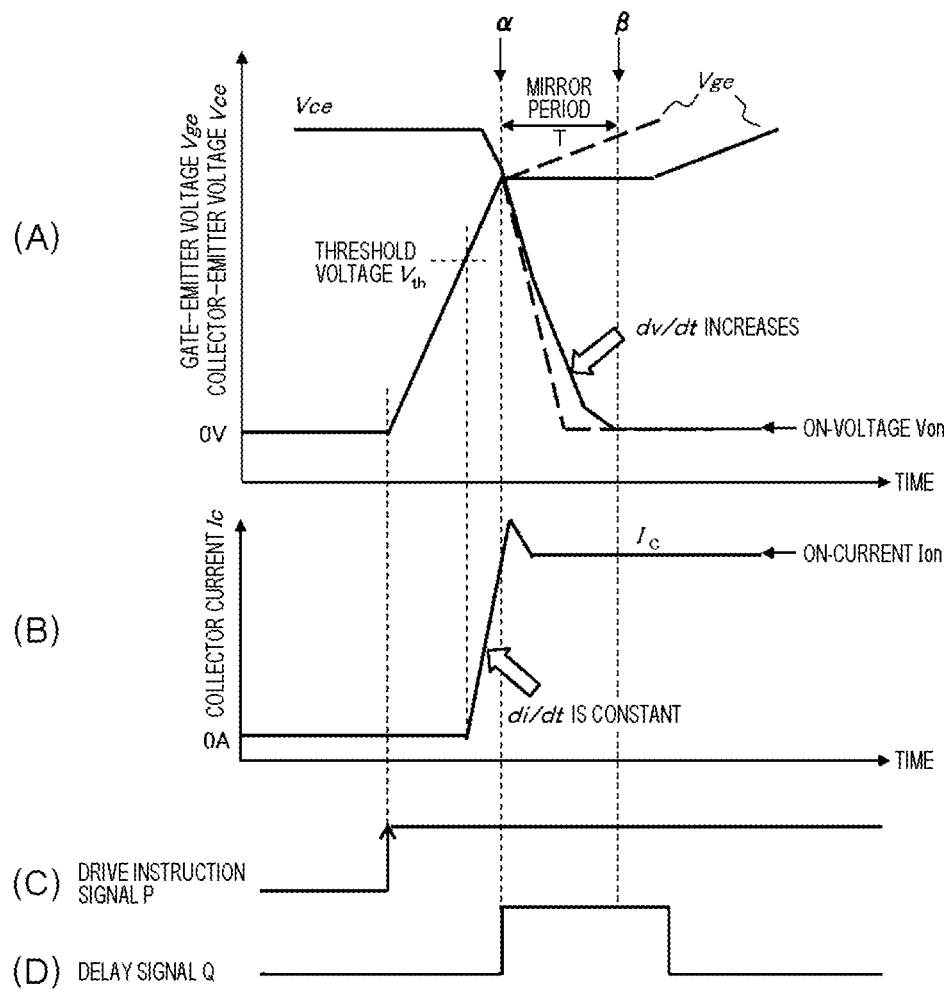
FIGS. 3(A), 3(B), 3(C), and 3(D) depict a switching operation of a semiconductor element.
Figure 9:
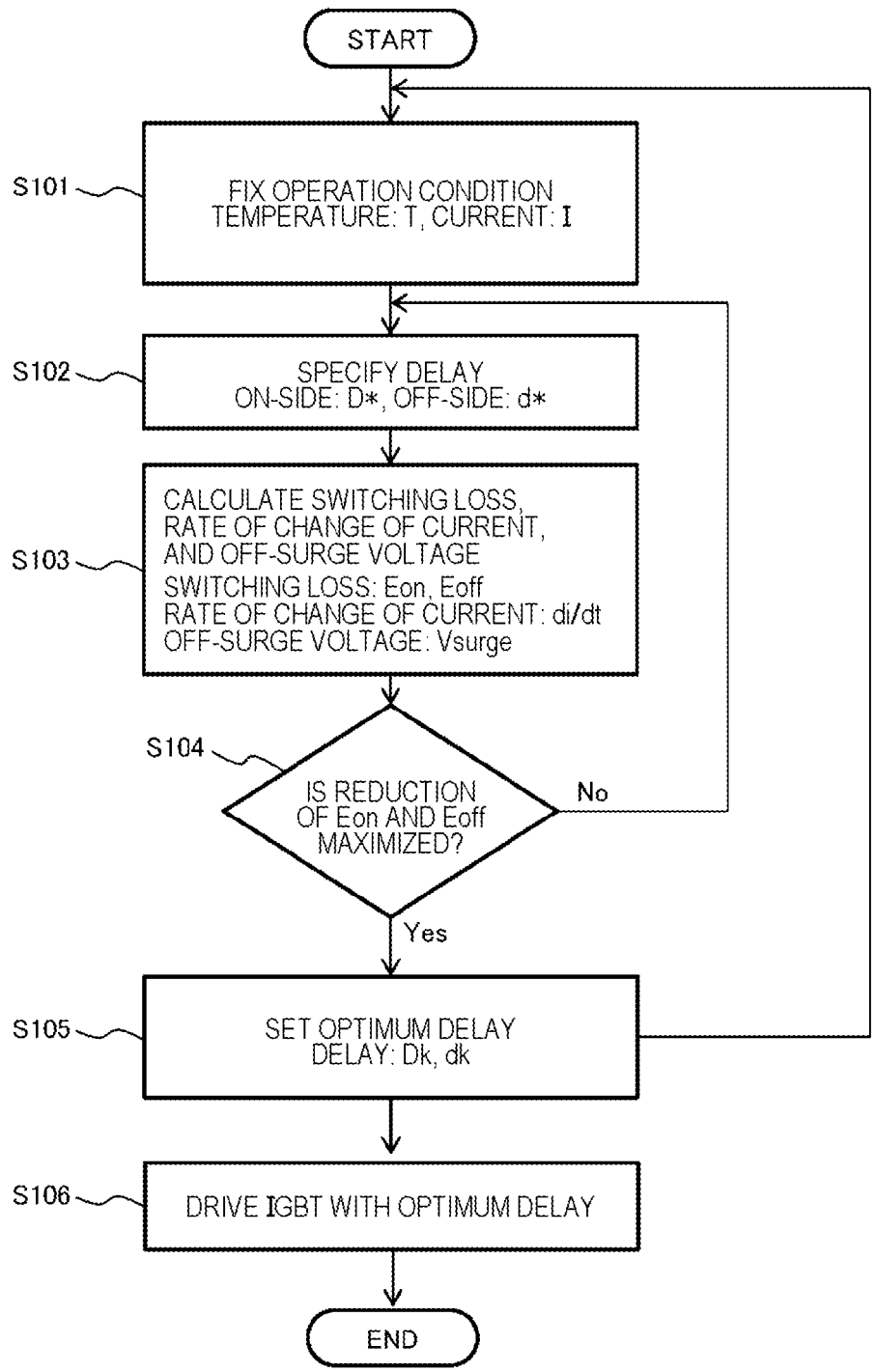
FIG. 9 is a flowchart showing processes by a delay control unit.

FIG. 9 is a flowchart showing processes by the delay control unit 14. By executing the processes shown in this flowchart, the optimal delays D and d are set in accordance with the temperature I and the current I of the IGBT 101 so that even if the operating condition (the temperature T or current I of IGBT 101) changes, a reduction of switching loss can always be maximized. Specifically, the delays D and d are set such that rising of the delay signal Q to the current increasing circuit 5 matches the point of time $\alpha$ of start of the mirror period, as shown in FIG. 3.

By executing the processes shown in FIG. 9, the delay control unit 14 determines optimum operation timing (delay D and d) of the current increasing circuit 5 in accordance with the temperature T and the current I. As described with reference to FIG. 4, the time to take from the point of input of the drive instruction signal P to the point of arrival of the mirror period gets shorter as the temperature T gets higher. This suggests a need of reducing the delay D. However, the time to take to reach the point of arrival of the mirror period changes due to various factors. For example, when a built-in gate resistance of the IGBT 101 shows positive temperature dependency, the higher temperature T increases the built-in gate resistance, in which case the IGBT 101 takes much time to turn on. This could be a case where the time to take to reach the point of arrival of the mirror period rather gest longer. It is therefore desirable that, as described below, the optimum delay be experimentally determined by measuring the temperature T and the current I of the IGBT 101. It is also desirable that the optimal delay be derived separately for each IGBT 101, i.e., each arm of each phase as individual differences (characteristic variations) between IGBTs 101 are taken into consideration.

At step S101 of FIG. 9, a given one operation condition (temperature T, current I) for the IGBT 101 is set. In this case, the temperature T and the current I are set to a temperature T and a current I1, respectively, as fixed operation conditions.

The operation condition as the temperature T1 is set, for example, by putting the entire power conversion apparatus 200 (the three-phase inverter circuit and the semiconductor element drive device 500) in a thermostatic bath which is set at the temperature T1. Because the current I1 increases in proportional to a time during which the IGBT 101 is turned on to let current flow therethrough, that is, a time during which the drive instruction signal P is kept inputted to the semiconductor element drive device 500 (input time Ton in FIG. 8), the operation condition as the current I1 is set by controlling the input time Ton in such a way as to make the current flowing through the IGBT 101 equal to the current Subsequently, at step S102 of FIG. 9, timing for the current increasing circuit 5 to increase the gate current (delays D and d shown in FIG. 8) is specified. Specifically, to the timing control unit 3, the delay control unit 14 specifies D*1 and d*1 via the digital input terminal 16 shown in FIG. 7, D*1 and d*1 being specified as respective delays of the delay signals Qp and Qn that are inputted to the current increasing circuit 5. At this time, the current increasing circuit 5 outputs the gate current that follows the specified delays (D*1 and d*1), to the gate terminal G of the IGBT 101.

Subsequently, at step 103 of FIG. 9, the IGBT 101 is caused to switch with the specified delay D*1 by the semiconductor element drive device 500, and switching loss (turn-on switching loss Eon) of the IGBT 101 and a rate of change (di/dt) of the collector current Ic of the IGBT 101 in this switching operation are obtained. Likewise, at the same step 103, the IGBT 101 is caused to switch with the specified delay d*1 by the semiconductor element drive device 500, and switching loss (turn-off switching loss Eoff) of the IGBT 101 and a peak value (off-surge voltage Vsurge) of the collector-emitter voltage Vce of the IGBT 101 in this switching operation are obtained.

At this step 103, the collector-emitter voltage Vce of the IGBT 101 is detected by, for example, a high-voltage probe and is inputted to a measuring device (e.g., a digital oscilloscope) having an arithmetic function. Hence the peak value of the collector-emitter voltage Vce in turn-off mode, that is, the off-surge voltage Vsurge is obtained. The collector current Ic of the IGBT 101 is detected by, for example, a current probe, a current transformer, or the like, and is inputted to a measuring device having a calculation function. Hence the gradient of the collector current Ic, that is, the rate of change di/dt of the collector current Ic is obtained. The measuring device having the calculation function calculates a time integral of a power value (product of V and I), from waveforms of the collector-emitter voltage Vce and the collector current Ic that result when the IGBT 101 switches, thereby obtaining the turn-on switching loss (Eon) and turn-off switching loss (Eoff) of the IGBT 101.

In this embodiment, an example in which the switching loss, the rate of change of current, and the off-surge voltage are experimentally obtained, using the high-voltage probe, the measuring device, or the like is described. These devices or devices having equivalent functions may be incorporated in the power conversion apparatus 200. In such a case, by regularly executing the processes of FIG. 9 using the device incorporated in the power conversion apparatus 200, a time-dependent change in the IGBT 101 can be kept in check.

Subsequently, at step 104 of FIG. 9, whether a reduction of switching loss (Eon and Eoff) is maximized is determined. This step will be described below with reference to FIGS. 10 and 11.

Figure 10:
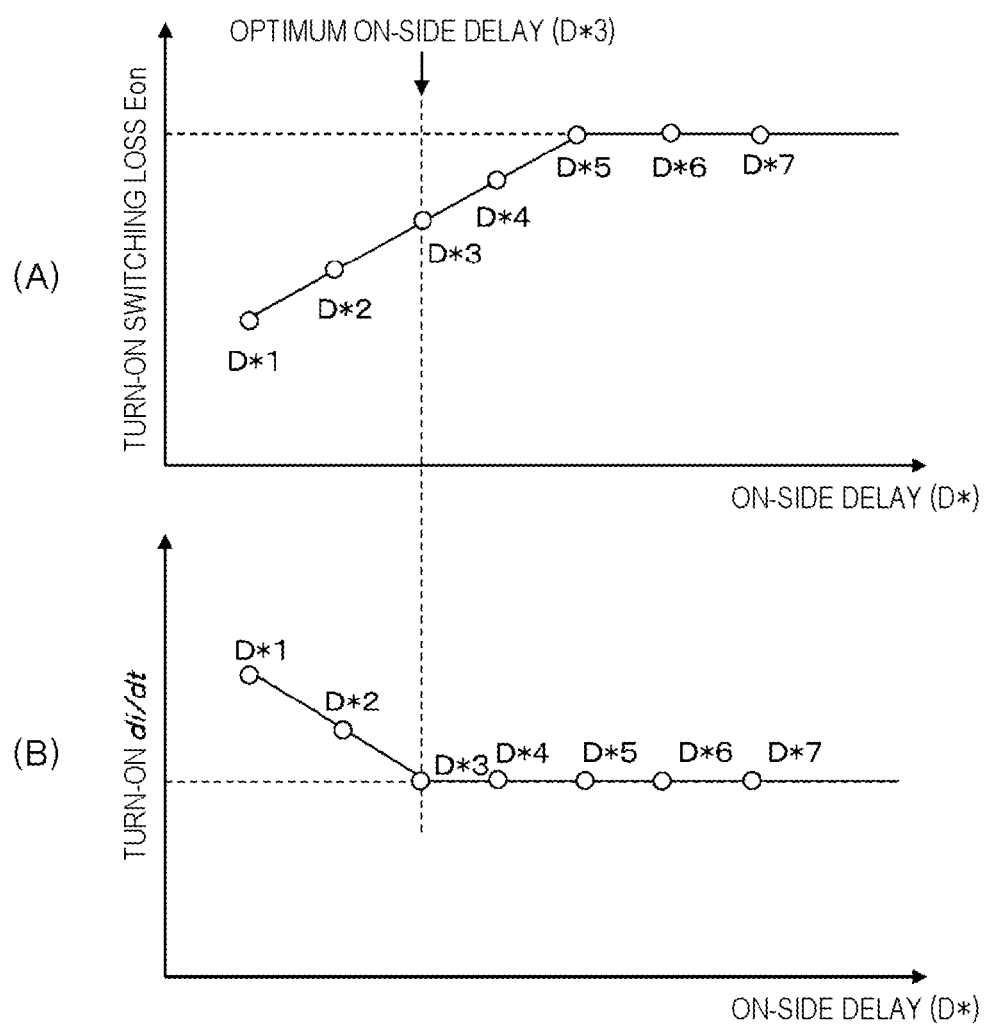
FIGS. 10(A) and 10(B) are graphs showing a relationship between turn-on switching loss and an on-side delay and a relationship between a rate of change of a collector current and an on-side delay, respectively.

FIG. 10 shows graphs of a relationship between the turn-on switching loss and the on-side delay D* and a relationship between the rate of change of the collector current Ic, and the on-side delay D*. FIG. 10 (A) is an example of a graph showing a relationship between the turn-on switching loss (Eon) of the IGBT 101 and the on-side delay (D*) specified to the current increasing circuit 5 at step 102 of FIG. 9. The vertical axis represents the turn-on switching loss, and the horizontal axis represents the size of the on-side delay. FIG. 10(B) is an example of a graph showing a relationship between the rate of change di/dt of current at the time of the IGBT 101 being in turn-on mode and the on-side delay (D*). The vertical axis represents the rate of change di/dt of current in turn-on mode, and the horizontal axis represents the size of the on-side delay.

When the delay D*, which determines timing for the current increasing circuit 5 to increase the gate current to the IGBT 101, changes, the effect of reduction of switching loss and noise (di/dt) caused by switching change. In particular, when the delay D* is set such that rising of the delay signal Q, which determines timing of driving the current increasing circuit 5, matches the point of time α of arrival of the mirror period, as shown in FIG. 3, the effect of reduction of turn-on switching loss can be maximized without increasing di/dt (that is, with di/dt kept the same as in the conventional case). The example shown in FIG. 10 (B) demonstrates that when the delay is set smaller than D*3, the rate of change di/dt in turn-on mode starts to increase. It is therefore determined that the optimum delay under the operating condition (T1, I1) is D*3. Specifically, in controlling turn-on of the semiconductor element through rising of the drive instruction signal P, the timing control unit 3 carries out control in such a way as to output the delay signal Q at a point of time which is before the rate of change di/dt of current starts increasing and at which the turn-on switching loss of the semiconductor element is minimized.

Figure 11:
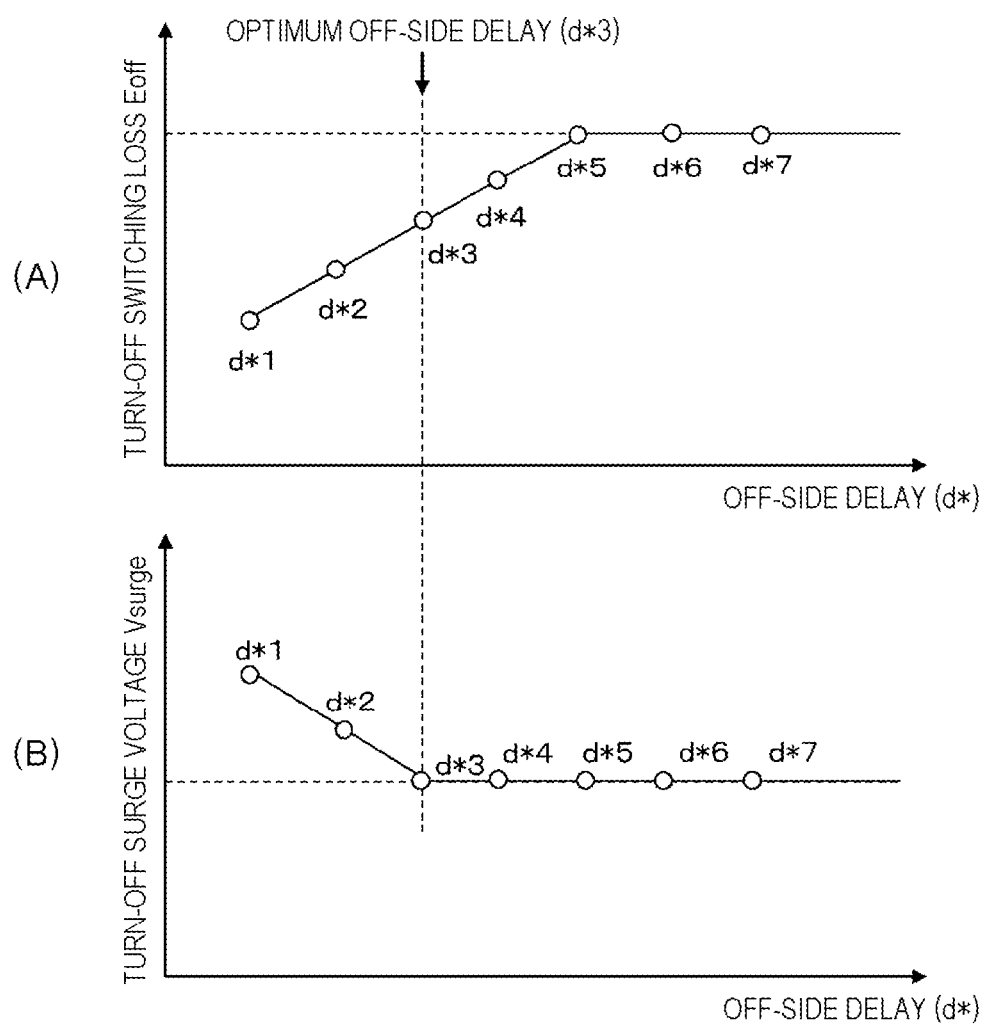
FIGS. 11(A) and 11(B) are graphs showing a relationship between turn-off switching loss and an off-side delay and a relationship between a surge voltage Vsurge and an off-side delay, respectively.

FIG. 11 shows graphs of a relationship between the turn-off switching loss and the off-side delay (d*) and a relationship between the surge voltage Vsurge and the off-side delay (d*). FIG. 11(A) is an example of a graph showing a relationship between the turn-off switching loss (Eoff) of the IGBT 101 and the off-side delay (d*) specified to the current increasing circuit 5 at step 102 of FIG. 9. The vertical axis represents the turn-off switching loss, and the horizontal axis represents the size of the off-side delay. FIG. 11(B) is an example of a graph showing a relationship between the surge voltage Vsurge at the time of the IGBT 101 being in turn-off mode and the off-side delay (d*). The vertical axis represents the surge voltage Vsurge in turn-off mode, and the horizontal axis represents the size of the off-side delay.

When the delay d*, which determines timing for the current increasing circuit 5 to increase the gate current to the IGBT 101, changes, the effect of reduction of switching loss and noise (Vsurge) caused by switching change. In automobile applications, in particular, when the surge voltage Vsurge in turn-off mode becomes excessively large, it causes deterioration of insulation performance or the like of the electric motor, thus raising a concern about its reliability. It is therefore important that the turn-off switching loss Eoff is reduced as the surge voltage Vsurge in turn-off mode is kept equal to or smaller than a certain value. The example of FIG. 11 demonstrates that when the delay is set smaller than d*3, the surge voltage Vsurge in turn-off mode starts to increase. It is therefore determined that the optimum delay under the operating condition (T1, I1) is d*3. Specifically, in controlling turn-off of the semiconductor element through falling of the drive instruction signal P, the timing control unit 3 carries out control in such a way as to output the delay signal at a point of time which is before the turn-off surge voltage Vsurge of the semiconductor device starts increasing and at which the turn-off switching loss Eoff of the semiconductor element is minimized.

At step 104 of FIG. 9, whether a reduction of the turn-on switching loss Eon and that of the turn-off switching loss Eoff are maximized is determined, based on the graphs shown in FIGS. 10 and 11. When the reduction is not maximized, the process flow returns to step 102, at which different delays ((D* and d*) are specified, and then steps 102 to 104 are repeated. When it is determined at step 104 that the reduction of the turn-on switching loss Eon and that of the turn-off switching loss Eoff are maximized, the process flow proceeds to step S105, at which the delays (D*3 and d*3 shown in FIGS. 10 and 11) are set as the optimum delays (Di=D*3, d1=d*3) under the operation conditions (T1, I1).

When the optimum delays (D1, di) are set for the operating conditions (temperature T1, current I1) at step S105 (FIG. 9), steps S101 to S105 are then repeated for different operating conditions (temperature T2, current I2), and optimum delays (D2, d2) for the different operating conditions (temperature T2, current I2) are set.

In this manner, steps S101 to S105 are repeatedly executed as operation conditions are changed the number of times equal to the necessary number of data samples (n). As a result, at the end of step S105, n optimum delays (Dk, dk) corresponding to operation conditions (temperature Tk, current Ik) are obtained (k=1, 2, . . . , n). For example, when 5 different temperatures T and 5 different currents I are combined as variations in the operation condition to create a data set, a data set of 25 data samples is acquired.

Finally, at step S106 of FIG. 9, the IGBT 101 is driven with the optimum delay set in accordance with the temperature T and the current I of the IGBT, which achieves low-loss drive shown in FIG. 6. At step S106, each optimum delay (Dk, dk) corresponding to each operating condition (temperature Tk, current Ik) (k=1, 2, . . . , n) obtained by executing step S101 to 105 is entered in a lookup table of the delay control unit 14. The lookup table listing optimum delay entries is sent to the timing control unit 3, which stores the lookup table. Thereafter, the timing control unit 3 refers to the lookup table, based on the temperature of the semiconductor element or the current flowing through the semiconductor element, and control timing of outputting the delay signals Qp and Qn.

A program indicated by the flowchart of FIG. 9 may be executed by a computer (microcomputer) equipped with a CPU, a memory, and the like. All or a part of the program indicated by the flowchart of FIG. 9 may be executed by a hard logic circuit. The program indicated by the flowchart of FIG. 9 may be provided as a program stored in advance in a storage medium of the power conversion apparatus 200. Alternatively, the program may be stored in an independent storage medium or may be loaded and stored in the storage medium of the power conversion apparatus 200 through a network line. Further, the program may be a computer-readable program supplied in various forms, such as a form of data signal (carrier wave).

FIG. 12 depicts an example of the lookup table in the timing control unit 3.

A pulse time (temperature) Dtk shown in FIG. 12 represents a pulse time corresponding to the temperature T of the IGBT 101, which is sensing information inputted to the delay signal generating unit 3a. A pulse time (current) Dik represents a pulse time corresponding to the current I of the IGBT 101, which is sensing information inputted to the delay signal generating unit 3a. As shown in FIG. 12, in correspondence with the pulse time (temperature) Dtk and the pulse time (current) Dik, an on-side optimum delay Dk and an off-side optimum delay dk are set as delay information.

The timing control unit 3 stores delay information (on-side optimum delay Dk, off-side optimum delay dk) for generating a plurality of delay signals corresponding respectively to a plurality of temperatures of the semiconductor element or a plurality of currents flowing through the semiconductor element, and outputs a delay signal, based on delay information for generating a delay signal corresponding to a detected temperature of the semiconductor element or a detected current flowing through the semiconductor element.

By storing the lookup table of FIG. 12 in the timing control unit 3 of the semiconductor element drive device 500, even if the current operation conditions (temperature T, current I) of the IGBT 101 acquired by the temperature detection circuit 1 and the current detection circuit 2 change when the power conversion apparatus 200 is in operation, the IGBT 101 can be driven in such a way as to autonomously maximize a reduction of switching loss of the IGBT 101.

It should be noted that the contents of the lookup table stored in advance in the timing control unit 3 may be rewritten externally by a software-based means. As such a software-based rewriting means, a field programmable gate array (FPGA) may be adopted as the timing control unit 3, and the delay control unit 14 set as the lookup table may be compiled via the digital input terminal 16. This makes hardware replacement, such as replacement of a component of the semiconductor element drive device 500, unnecessary at the time of setting the delay (D*, d*) specified to the current increasing circuit 5. A data set of the optimum delay (D and d) corresponding to each operating condition (temperature T, current I), therefore, can be obtained efficiently.

In the present embodiment, the temperature T and the current I of the IGBT 101 are taken into consideration as the operating conditions. However, the optimum delays (D and d) may be set by taken into consideration either the temperature T and the current only, as the operating condition. In addition, if necessary, the voltage V applied to the IGBT 101 may be additionally included in operation conditions to consider three operation conditions (temperature T, current I, voltage V). In such a case, the operating conditions are changed to a set of the temperature T, the current I, and the voltage V at step S101 in FIG. 9, and the same processes as described above are executed based on the changed operation conditions. When an automobile runs in normal driving mode, its battery voltage V is constant and therefore does not need to be taken into consideration. When the voltage V of the IGBT 101 is made variable through boost control or the like, however, including the voltage V in the operation conditions is effective.

It should be noted that this embodiment does not necessarily need to be implemented in all the operation areas of the semiconductor element. Specifically, switchover control may be carried out such that this embodiment is implemented to increase the gate current in an operation area of the semiconductor element where the switching loss increases, while the gate current is not increased in other operation areas. The timing control unit 3 outputs a delay signal to increase the gate current in the operation area of the semiconductor element where the switching loss increases. The operation area of the semiconductor element where the switching loss increases is an operation area where power from the power conversion apparatus 200 is needed.

The operation area of the semiconductor element where the switching loss increases is at least one of areas shown below: (1) an area where the temperature T of the IGBT is high, (2) an area where the current I flowing through the IGBT is large, (3) an area where the switching frequency of the IGBT is high, and (4) an area where the voltage applied to the IGBT is large. For example, acceleration or power regeneration of an electric vehicle and start, acceleration, or power regeneration of a hybrid vehicle raise the switching frequency of the IGBT and are therefore considered to be one of operation areas where the switching loss increases. It is desirable that in these operation areas, gate current control according to this embodiment be carried out. In addition, when a wide gap semiconductor, such as a MOSFET made of SIC, is used as the semiconductor element, instead of using an IGBT made of Si, the switching frequency increases further, in which case an effect of implementation of this embodiment is greater.

As described above, according to this embodiment, even when the operating condition (temperature T, current I, voltage V) for the IGBT changes, the semiconductor element drive device 500 can drive the IGBT 101 with low loss and low noise. In other words, a reduction of the switching loss Eon and Eoff of the IGBT 101 can be autonomously maximized without increasing the radiation noise di/dt and the overvoltage Vsurge. For example, this embodiment prevents such an unfavorable case where excessive suppression of the radiation noise di/dt and the overvoltage Vsurge leads to an increase in the switching loss Eon and Eoff or where giving first priority to reduction of the switching loss Eon and Eoff results in insufficient suppression of the radiation noise di/dt and the overvoltage Vsurge.

The semiconductor element drive device 500 of this embodiment is thus capable of driving the semiconductor device, such as the power semiconductor module including the circuit in which the IGETs and the freewheeling diodes are connected in parallel, with low loss and low noise. Hence the power conversion apparatus 200 including the arms making up the three-phase inverter circuit operates with less loss and noise.

Second Embodiment

Figure 13:
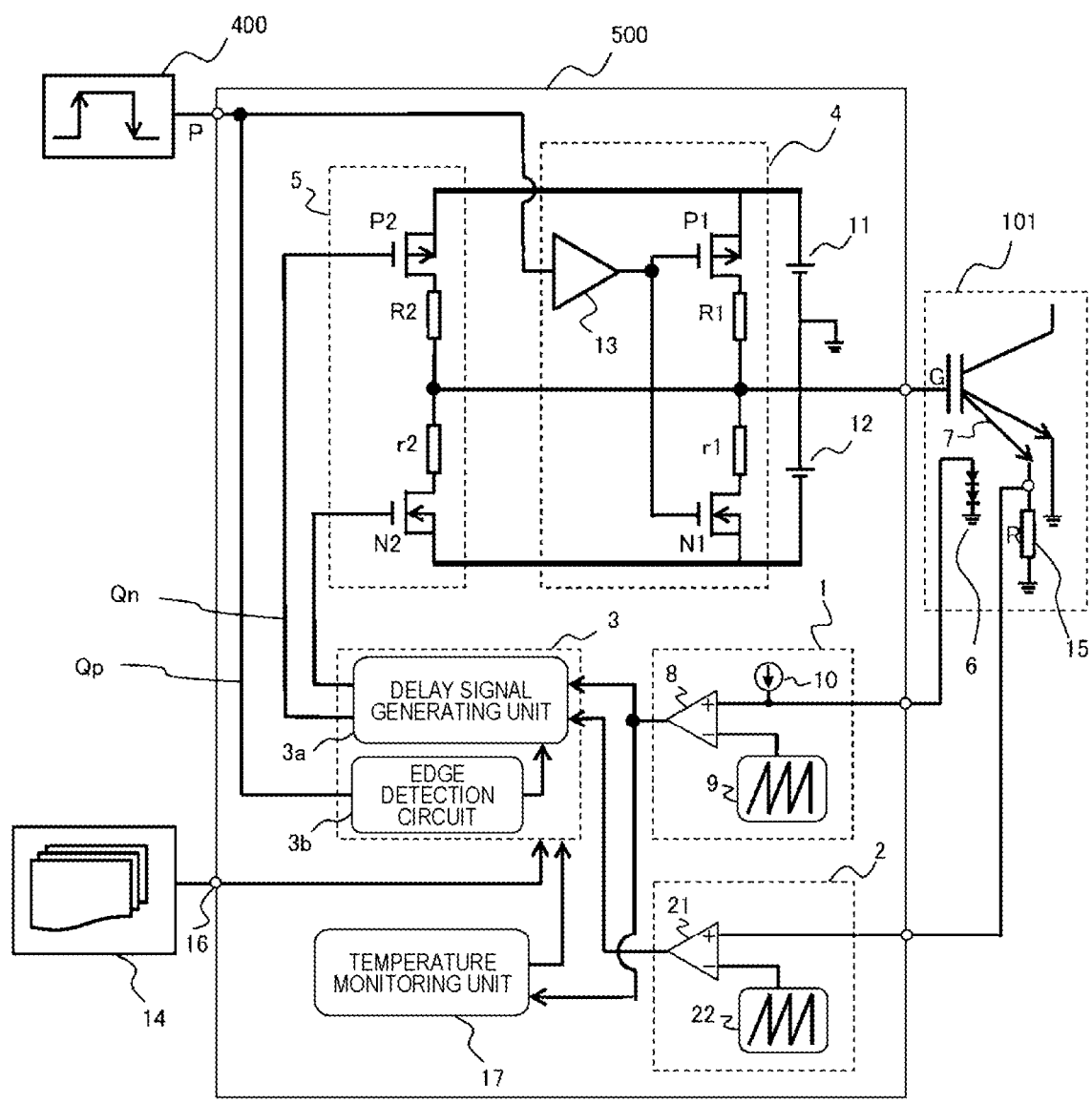
FIG. 13 depicts a circuit configuration of a semiconductor element drive device according to a second embodiment.

FIG. 13 depicts a circuit configuration of a semiconductor element drive device according to a second embodiment. The same components as depicted in the circuit configuration of the semiconductor element drive device of the first embodiment shown in FIG. 7 are denoted by the same reference numerals and are omitted in further description.

The semiconductor element drive device of the second embodiment shown in FIG. 13 additionally includes a temperature monitoring unit 17 disposed between an output portion of the temperature detection circuit 1 and an input portion of the timing control unit 3. In the first embodiment, the lookup table shown in FIG. 12 is stored in the timing control unit 3. In the second embodiment, on the other hand, a lookup table shown in FIG. 15, which will be described later, is stored in the timing control unit 3. Except these respects, the semiconductor element drive device of the second embodiment is identical in configuration with the semiconductor element drive device of the first embodiment shown in FIG. 7

Figures 14, 15:
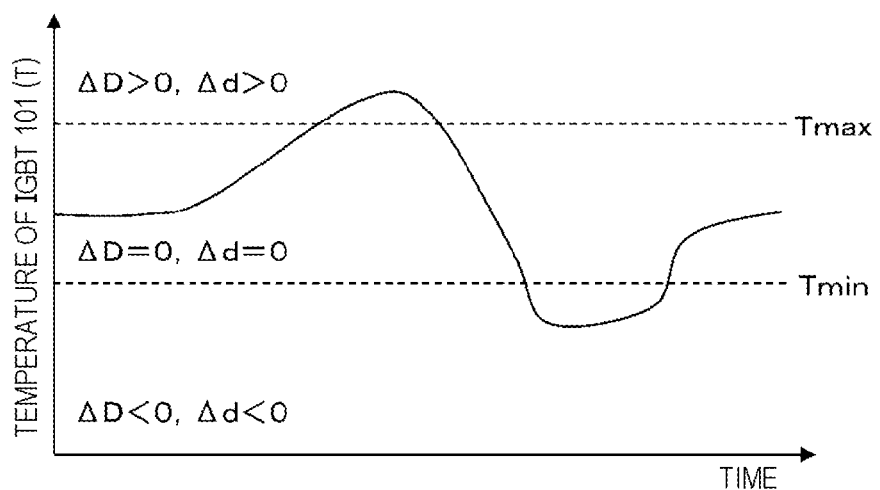
FIG. 14 is a graph showing an example of the temperature of an IGBT monitored by a temperature monitoring unit.
FIG. 15 depicts an example of a lookup table in the timing control unit according to the second embodiment.

FIG. 14 is a graph showing an example of the temperature of the IGBT 101 monitored by the temperature monitoring unit 17. The temperature monitoring unit 17 shown in FIG. 13 has a recording function, and records a log of sensing information on the temperature I of the IGBT 101, the sensing information being outputted from the temperature detection circuit 1. As indicated in FIG. 14, the temperature monitoring unit 17 determines whether the temperature T of the IGBT 101 remains within a range between an upper limit value Tmax and a lower limit value Tmin that are specified in advance.

When the temperature T of the IGBT 101 is within the range between Tmax and Tmin, the temperature monitoring unit 17 transmits a normal signal to the timing control unit 3. When the temperature T of the IGBT 101 is out of the range between Tmax and Tmin, the temperature monitoring unit 17 transmits an abnormality signal to the timing control unit 3.

FIG. 15 depicts an example of a lookup table according to this embodiment, the lookup table being stored in the timing control unit 3. This lookup table is different from the lookup table according to the first embodiment shown in FIG. 12 in that for each temperature (Dtk) and each current (Dik), the values of the on-side optimum delay Dk and the off-side optimum delay dk are uniformly changed by $\Delta D$ and $\Delta d$, respectively. $\Delta D$ and $\Delta d$ are fixed values that are positive or negative or zero. In this embodiment, the delay control unit 14 sets entries to the lookup table shown in FIG. 15 by the processes described with reference to FIG. 9.

When the temperature monitoring unit 17 determines that the temperature T of the IGBT 101 remains within the range between Tmax and Tmin (Tmin<T<Tmax), $\Delta D=0$ and $\Delta d=0$ holds, as shown in FIG. 14, in which case the operation of the timing control unit 3 is the same as that in the first embodiment.

When the temperature monitoring unit 17 determines that the temperature T of the IGBT 101 is above Tmax (T>Tmax), $\Delta D>0$ and $\Delta d>0$ holds, as shown in FIG. 14, in which case the temperature monitoring unit 17 transmits a first abnormality signal to the timing control unit 3. In response to the first abnormality signal, the timing control unit 3 causes the current increasing circuit 5 to operate at points of time earlier by $\Delta D$ and $\Delta d$ than in the case of the first embodiment. As a result, the IGBT 101 turns on earlier by $\Delta D$ and turns off earlier by $\Delta d$ than in the case of the first embodiment. Thus, as shown in FIGS. 10 and 11, the switching loss Eon and Eoff decreases, and consequently the temperature T of the IGBT 101 drops.

When the temperature monitoring unit 17 determines that the temperature T of the IGBT 101 is below Tmin (T<Tmin), ΔD<0 and Δd<0 holds, as shown in FIG. 14, in which case the temperature monitoring unit 17 transmits a second abnormality signal to the timing control unit 3. In response to the second abnormality signal, the timing control unit 3 causes the current increasing circuit 5 to operate at points of time later by ΔD and Δd than in the case of the first embodiment. As a result, the IGBT 101 turns on later by ΔD and turns off later by Δd than in the case of the first embodiment. Thus, as shown in FIGS. 10 and 11, the switching loss Eon and Eoff increases, and consequently the temperature T of the IGBT 101 rises.

In this manner, by adding the temperature monitoring unit 17 and changing the contents of the lookup table, timing of operation of the current increasing circuit 5 in the semiconductor element drive device 500 is adjusted in such a way as to keep the temperature T of the IGBT 101 within the range between Tmax and Tmin. This provides the semiconductor element drive device 500 with a temperature feedback control function.

In this manner, according to this embodiment, even when the value of the optimum delay set in accordance with the operation condition (temperature T, current I) deviates from an initial set value due to a time-dependent change in the characteristics of the IGBT 101, aged deterioration of thermal resistance around the IGBT 101, and the like, the temperature of the IGBT 101 can be kept within a certain range, which offers an advantage of more reliable driving and sound control.

Third Embodiment

Figure 16:
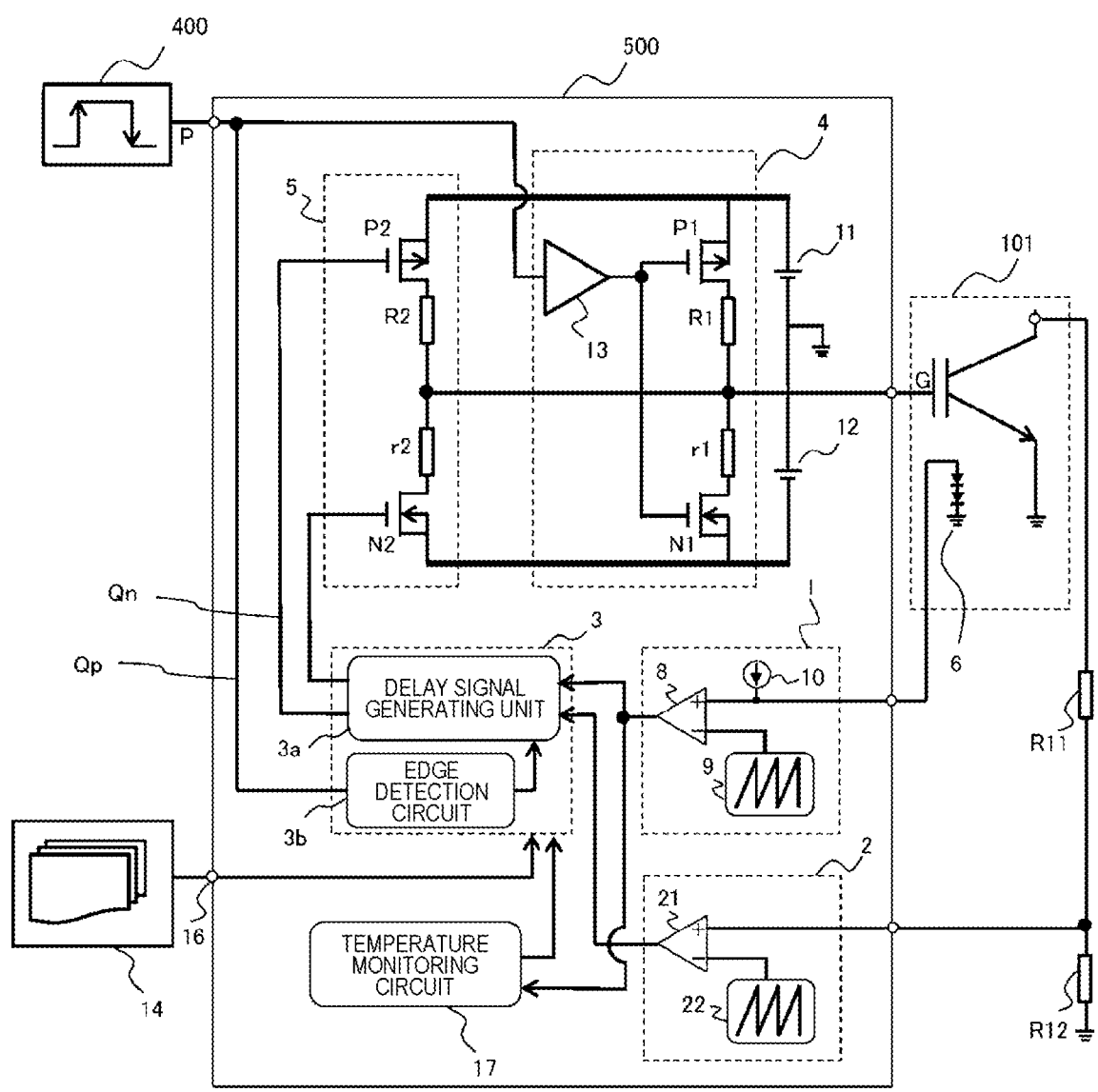
FIG. 16 depicts a circuit configuration of a semiconductor element drive device according to a third embodiment.

FIG. 16 depicts a circuit configuration of a semiconductor element drive device according to a third embodiment. The same components as depicted in the circuit configuration of the semiconductor element drive device of the second embodiment shown in FIG. 13 are denoted by the same reference numerals and are omitted in further description.

A correspondence relationship holds between the on-voltage (Von) of the IGBT 101 and the current Ic flowing through the IGBT 101. Based on this fact, the third embodiment dispenses with the sense IGBT used as the current detection element 7 in the first embodiment and the second embodiment, and detects the on-voltage (Von) of the IGBT 101, instead, thereby indirectly detecting current Ic. In this embodiment, the voltage of the IGBT 101 inputted to the current detection circuit 2 is dropped through voltage dividing resistances R11 and R12. This prevents a case where a high applied voltage from the IGBT 101 is applied to the current detection circuit 2 as an excessive voltage that destroys the semiconductor element drive device 500.

Although this embodiment does not have the current detection element 7 (sense IGBT or the like) mounted on the IGBT chip, the embodiment achieves the same functions as those achieved by the first embodiment and the second embodiment. This embodiment is, therefore, not limited in function by a specific IGBT chip. In addition, as in the case of this embodiment, indirectly obtaining the current Ic makes a detection element, such as a current sensor, unnecessary, which contributes to a reduction in the cost of the power conversion apparatus 200. Further, the timing control unit 3, the current output circuit 4, and the current increasing circuit 5, which are shown in FIG. 16, may be not separately provided as discrete components but may be provided as packaged components incorporated in an IC or an ASIC. This approach further reduces cost and the number of components, and offers an advantage of improved reliability as well.

It should be noted that the present invention is not limited to the above first to third embodiments but includes various modifications. For example, each of the above embodiments has been described in detail for easy understanding of the present invention, and is not necessarily limited to an embodiment including all the constituent elements described above. In addition, some of constituent elements of each embodiment can be deleted therefrom or add to or replaced with constituent elements of another embodiment. For example, each embodiment described above is not limited to the three-phase inverter circuit, and can be applied also to a power conversion apparatus including a pair of upper and lower arms. Such a pair of upper and lower arms may be configured such that a single arm or a plurality of arms are housed in a power semiconductor module case and that an electrode terminal is led out of the case. The power semiconductor module may house the semiconductor element drive device 500 therein.

The semiconductor element making up the arm is not limited to the IGBT, and may be a power MOSFET. In such a case, a parasitic diode (body diode) of the power MOSFET may be used as the freewheeling diode. As the freewheeling diode, various types of diodes may be used, which include a pn junction diode, a Schottky barrier diode, and a diode combining a pn junction and a Schottky junction.

The embodiments described above offers the following effects.

(1) The semiconductor element drive device 500 includes: the current output circuit 4 that outputs the gate current to the semiconductor element (IGBT 101), based on the drive instruction signal P for controlling on/off of the semiconductor element; the current increasing circuit 5 that increases the gate current, based on the delay signal Q that is outputted after an elapse of a given time from a reference point of time of rising of the drive instruction signal P or falling of the drive instruction signal P; and the timing control unit 3 that controls timing of output of the delay signal Q outputted during the mirror period that is after a point of time at which a current flowing through the semiconductor element reaches a given on-current value and before a point of time at which a voltage between both ends of the semiconductor element reaches a given on-voltage. The timing control unit 3 controls timing of output of the delay signal Q, based on at least either a temperature of the semiconductor element or a current flowing through the semiconductor element. Hence, even when the temperature of the semiconductor element or the current flowing through the semiconductor element changes, switching loss and noise can be reduced sufficiently.

REFERENCE SIGNS LIST 1 temperature detection circuit
2 current detection circuit
3 timing control unit
3a delay signal generating unit
3b edge detection circuit
4 current output circuit
5 current increasing circuit
6 temperature detection element
7 current detection element
8 comparator
9 sawtooth wave generating circuit
10 constant current source
11 positive-side voltage source
12 negative-side voltage source 13 pre-driver
14 delay control unit
15 shunt resistance
16 digital input terminal
17 temperature monitoring unit
R11, R12 voltage dividing resistance
P1, P2 p-type MOSFET
N1, N2 n-type MOSFET
R1, R2, r1, r2 gate resistance
100 battery
101 IGBT
102 freewheeling diode
110 smoothing capacitor
200 power conversion apparatus
300 electric motor
310 coil of electric motor
400 instruction logic unit
500 semiconductor element drive device

The invention claimed is:

1. A semiconductor element drive device comprising:
a current output circuit that outputs a gate current to a semiconductor element, based on a drive instruction signal for controlling on/off of the semiconductor element;
a current increasing circuit that increases the gate current, based on a delay signal that is outputted after an elapse of a given time from a reference point of time of rising of the drive instruction signal or falling of the drive instruction signal; and
a timing control unit that controls timing of output of the delay signal outputted during a mirror period that is after a point of time at which a current flowing through the semiconductor element reaches a given on-current value and before a point of time at which a voltage between both ends of the semiconductor element reaches a given on-voltage,
wherein the timing control unit controls timing of output of the delay signal, based on at least either a temperature of the semiconductor element or a current flowing through the semiconductor element.

2. The semiconductor element drive device according to claim 1,
wherein the timing control unit outputs the delay signal immediately after a current flowing through the semiconductor element reaches the on-current value, and
the current increasing circuit increases the gate current immediately after the current flowing through the semiconductor element reaches the on-current value, based on the delay signal.

3. The semiconductor element drive device according to claim 1, wherein in controlling turn-on of the semiconductor element through rising of the drive instruction signal, the timing control unit outputs the delay signal at a point of time which is before a rate of change of a current flowing through the semiconductor element starts increasing and at which turn-on switching loss of the semiconductor element is minimized.

4. The semiconductor element drive device according to claim 1, wherein in controlling turn-off of the semiconductor element through falling of the drive instruction signal, the timing control unit outputs the delay signal at a point of time which is before a turn-off surge voltage of the semiconductor element starts increasing and at which turn-off switching loss of the semiconductor element is minimized.

5. The semiconductor element drive device according to claim 1, wherein the timing control unit controls timing of outputting the delay signal, based on a voltage applied to the semiconductor element.

6. The semiconductor element drive device according to claim 1, wherein the timing control unit outputs the delay signal in an operation area of the semiconductor element where turn-on switching loss or turn-off switching loss increases.

7. The semiconductor element drive device according to claim 6, wherein the operation area is at least one of areas shown below: an area where a temperature of the semiconductor element is high, an area where a current flowing through the semiconductor element is large, an area where a switching frequency of the semiconductor element is high, and an area where a voltage applied to the semiconductor element is large.

8. The semiconductor element drive device according to any one of claims 1 to 7, wherein the timing control unit stores delay information for generating a plurality of the delay signals corresponding respectively to a plurality of temperatures of the semiconductor element or a plurality of the currents flowing through the semiconductor element, and outputs the delay signal, based on the delay information corresponding to a detected temperature of the semiconductor element or to a detected current flowing through the semiconductor element.

9. The semiconductor element drive device according to claim 8, wherein the delay information stored in the timing control unit is rewritable.

10. The semiconductor element drive device according to claim 8, comprising a temperature monitoring unit that when a temperature of the semiconductor element rises above a preset upper limit value, transmits a first abnormality signal to the timing control unit, and that when a temperature of the semiconductor element drops below a preset lower limit value, transmits a second abnormality signal to the timing control unit,
wherein in response to the first abnormality signal, the timing control unit makes a point of time of outputting the delay signal, the point of time being based on the delay information, earlier by a given time $\Delta D$ when the semiconductor element is in turned-on mode, and makes the point of time of outputting the delay signal earlier by a given time $\Delta d$ when the semiconductor element is in turned-off mode, and
in response to the second abnormality signal, the timing control unit makes a point of time of outputting the delay signal, the point of time being based on the delay information, later by the given time $\Delta D$ when the semiconductor element is in turned-on mode, and makes the point of time of outputting the delay signal later by the given time $\Delta d$ when the semiconductor element is in turned-off mode.

11. The semiconductor element drive device according to any one of claims 1 to 7, wherein a temperature of the semiconductor element is detected, based on a measurement by a temperature detection diode packaged on a semiconductor chip on which the semiconductor element is mounted, or on a measurement by a thermistor, or on a measurement of an electrical characteristic parameter of the semiconductor element, the parameter changing depending on a temperature of the semiconductor element.

12. The semiconductor element drive device according to any one of claims 1 to 7, wherein a current flowing through the semiconductor element is detected, based on a measurement by a sense element packaged on a semiconductor chip on which the semiconductor element is mounted, or on a measurement by a current probe, or on a measurement of an on-voltage of the semiconductor element.

13. The semiconductor element drive device according to any one of claims 1 to 7, wherein the semiconductor element is a voltage-driven semiconductor element including an IGBT made of silicon or a MOSFET made of a wide-gap semiconductor.

14. A power conversion apparatus comprising:
the semiconductor element drive device according to any one of claims 1 to 7; and
a pair of upper and lower arms of the semiconductor elements driven by the semiconductor element drive device.

15. The power conversion apparatus according to claim 14, wherein the semiconductor element driven by the semiconductor element drive device makes up a three-phase inverter circuit.

* * * * *